(12) United States Patent
Wang et al.

(10) Patent No.: US 12,029,085 B2
(45) Date of Patent: Jul. 2, 2024

(54) DISPLAY PANEL AND METHOD FOR MANUFACTURING THE SAME, DISPLAY DEVICE AND ELECTRONIC APPARATUS

(71) Applicant: BOE Technology Group Co., Ltd., Beijing (CN)

(72) Inventors: Li Wang, Beijing (CN); Bo Wang, Beijing (CN); Jingquan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 451 days.

(21) Appl. No.: 17/417,608

(22) PCT Filed: Dec. 29, 2020

(86) PCT No.: PCT/CN2020/140892
§ 371 (c)(1),
(2) Date: Jun. 23, 2021

(87) PCT Pub. No.: WO2021/136276
PCT Pub. Date: Jul. 8, 2021

(65) Prior Publication Data
US 2022/0344437 A1    Oct. 27, 2022

(30) Foreign Application Priority Data
Jan. 3, 2020   (CN) .......................... 202010006042.1

(51) Int. Cl.
*H10K 59/131*   (2023.01)
*H10K 59/12*    (2023.01)

(52) U.S. Cl.
CPC ....... *H10K 59/131* (2023.02); *H10K 59/1201* (2023.02)

(58) Field of Classification Search
None
See application file for complete search history.

(56) References Cited

U.S. PATENT DOCUMENTS 10,062,316 B2 *   8/2018   Kim ..................... G09G 3/2092
2005/0052439 A1 * 3/2005   Liou ........................ G09G 3/20
345/204

(Continued)

FOREIGN PATENT DOCUMENTS

CN    103946740 A    7/2014
CN    106647067 A    5/2017

(Continued)

OTHER PUBLICATIONS

Second Office Action dated Sep. 27, 2022 corresponding to Chinese application No. 202010006042.1.

(Continued)

*Primary Examiner* — Cory W Eskridge
(74) *Attorney, Agent, or Firm* — Nath, Goldberg & Meyer; Joshua B. Goldberg

(57) ABSTRACT

The disclosure provides a display panel, a method of manufacturing the same, a display device, and an electronic apparatus. The display panel includes a display area and a non-display area, where the display panel further includes: at least one signal bus located in and across the display area; a plurality of metal wires located in the display area and each having an end electrically coupled to the at least one signal bus; and a control circuit located in the non-display area and electrically coupled to another end of each metal wire.

9 Claims, 3 Drawing Sheets

(56) References Cited

U.S. PATENT DOCUMENTS

2014/0253419 A1* 9/2014 Tanada .................... G09G 3/20
                                                                   345/55
2018/0040684 A1* 2/2018 Matsueda ............ H10K 59/131
2021/0225996 A1* 7/2021 Yu ......................... H10K 71/00

FOREIGN PATENT DOCUMENTS

| CN | 109713024 A | 5/2019 |
| CN | 110249430 A | 9/2019 |
| CN | 110599898 A | 12/2019 |
| CN | 111192903 A | 5/2020 |
| JP | 2010027489 A | 2/2010 |

OTHER PUBLICATIONS

First Office Action issued on Feb. 23, 2022 for application No. CN202010006042.1 with English translation attached.

* cited by examiner

DISPLAY PANEL AND METHOD FOR MANUFACTURING THE SAME, DISPLAY DEVICE AND ELECTRONIC APPARATUS

CROSS-REFERENCE TO RELATED APPLICATIONS

This is a National Phase Application filed under 35 U.S.C. 371 as a national stage of PCT/CN2020/140892, filed Dec. 29, 2020 an application claiming priority to Chinese Application No. 202010006042.1, filed Jan. 3, 2020 the contents of each which are hereby incorporated by reference in its entirety.

TECHNICAL FIELD

The present disclosure relates to the field of display technology, and more particularly, to a display panel, a method of manufacturing a display panel, a display device, and an electronic apparatus.

BACKGROUND

An AMOLED (Active Matrix Organic Light Emitting Diode) display has the advantages of self-luminescence, ultra-thinness, fast response, high contrast, wide viewing angle, and the like, and is a display device that is widely focused at present.

SUMMARY

In an aspect, the present disclosure provides a display panel having a display area and a non-display area; where the display panel further includes: at least one signal bus located in and across the display area; a plurality of metal wires located in the display area and each having an end electrically coupled to the at least one signal bus; and a control circuit located in the non-display area and electrically coupled to another end of each of the metal wires.

In some implementations, the signal bus includes a first signal bus along a first direction, the first signal bus divides the display area into a first area and a second area, and metal wires in the first area and metal wires in the second area are respectively coupled with the first signal bus.

In some implementations, a total length of all pixels in the first area coupled to the first signal bus in a second direction is reduced by ½ of a width of the first signal bus in the second direction, and a total length of all pixels in the second area coupled to the first signal bus in the second direction is reduced by ½ of the width of the first signal bus in the second direction, the first direction and the second direction being perpendicular to each other.

In some implementations, the first signal bus passes through a center of the display area.

In some implementations, the signal bus include a first signal bus in a second direction and a second signal bus in a first direction, the first direction and the second direction are perpendicular to each other, a portion of the plurality of metal wires are electrically coupled to the first signal bus, and the other portion of the plurality of metal wires are electrically coupled to the second signal bus.

In some implementations, the display area is divided by the first signal bus and the second signal bus into a first area, a second area, a third area, and a fourth area arranged in a counterclockwise direction, metal wires in the first and third areas being electrically coupled with the first signal bus, and metal wires in the second and fourth areas being electrically coupled with the second signal bus.

In some implementations, a total length of all pixels coupled with the first signal bus in the first direction is reduced by ½ of a width of the first signal bus in the first direction, and a total length of all pixels coupled with the second signal bus in the second direction is reduced by ½ of a width of the second signal bus in the second direction.

In some implementations, the width of the first signal bus in the first direction is the same as the width of the second signal bus in the second direction.

In some implementations, the first signal bus and the second signal bus each pass through a center of the display area.

In some implementations, the signal bus includes a first signal bus, a second signal bus, and a third signal bus that are parallel to each other in a first direction, where a portion of the plurality of metal wires is electrically coupled to the first signal bus, another portion of the plurality of metal wires is electrically coupled to the second signal bus, and a remaining portion of the plurality of metal wires is electrically coupled to the third signal bus.

In some implementations, a total length of all pixels coupled with the first signal bus in the second direction is reduced by ½ of a width of the first signal bus in the second direction, a total length of all pixels coupled with the second signal bus in the second direction is reduced by ½ of a width of the second signal bus in the second direction, and a total length of all pixels coupled with the third signal bus in the second direction is reduced by ½ of a width of the third signal bus in the second direction.

In some implementations, the widths of the first signal bus, the second signal bus, and third signal bus in the second direction are the same.

In some implementations, the signal bus includes at least one of a negative voltage signal line, a display control signal line, a direct current signal line, and a power supply signal line.

In some implementations, in response to that at least one signal line of the signal bus is provided in the display area, the remaining signal lines of the signal bus are provided in the non-display area at a periphery of the display area.

In some implementations, the control circuit includes a pixel compensation circuit.

In another aspect, the present disclosure provides a display device, including the display panel described herein.

In some implementations, the display device is circular or square in shape.

In another aspect, the present disclosure provides an electronic device, including the display device described herein.

In another aspect, the present disclosure provides a method of manufacturing the display panel described herein, including:

forming at least one signal bus in a first direction in the display area;

forming a plurality of metal wires in a second direction in the display area, where an end of each metal wire is electrically coupled with the at least one signal bus, and the second direction is perpendicular to the first direction; and forming a control circuit in the non-display area, where the control circuit is electrically coupled with another end of each metal wire.

In some implementations, the signal bus is formed to pass through a center of the display area.

DRAWINGS

The above and other features, objects and advantages of the concept of the present disclosure will become more apparent from the following detailed description of non-limiting embodiments thereof with reference to the accompanying drawings, in which.

DETAILED DESCRIPTION

Figure 1:
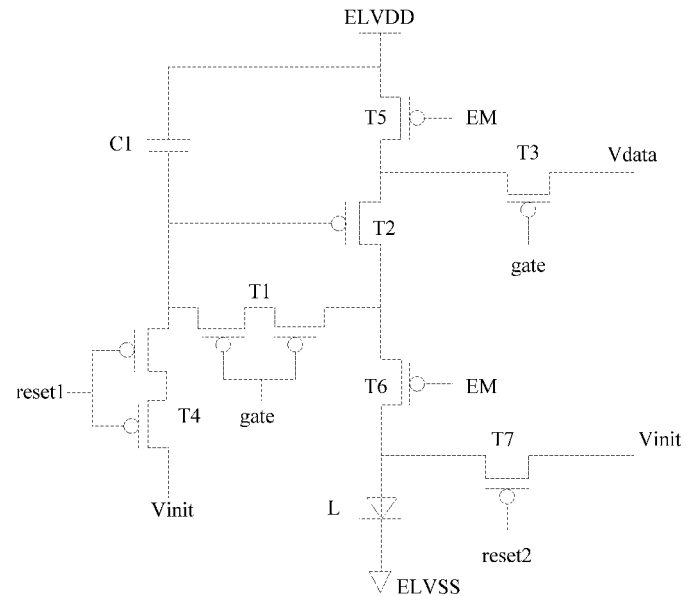
FIG. 1 is a schematic structural diagram of an example of a pixel compensation circuit according to the related art.

In order to make the technical solutions of the present disclosure better understood by those skilled in the art, the technical solutions of the present disclosure will be clearly and completely described below with reference to the accompanying drawings and specific embodiments. It is to be understood that the described embodiments are only a part of the embodiments of the present disclosure, but not all embodiments. All other embodiments obtained by a person of ordinary skill in the art based on the embodiments described in the present disclosure without creative efforts shall fall within the protection scope of the present disclosure.

In the description herein, the terms "first", "second", "third", "fourth", and the like (if any) are used for distinguishing between similar elements and not necessarily for describing a particular sequential or order. It is also to be understood that the objects so described are interchangeable under appropriate circumstances such that the embodiments of the present disclosure are capable of being implemented in other sequences than those illustrated or otherwise described herein. Furthermore, the features defined by "first", "second", "third", "fourth", etc. may explicitly or implicitly include at least one of the features. In the description of this specification, "plurality" means at least two, e.g., two, three, or more, unless explicitly specified otherwise.

In the description of the present specification, the terms "comprises", "includes", and "have" and any variations thereof, are intended to cover a non-exclusive inclusion, such that a process, method, system, article, or apparatus that includes a list of steps or modules is not necessarily limited to those steps or modules explicitly listed, but may include other steps or modules not expressly listed or inherent to such process, method, article, or apparatus.

In the description of the present specification, a description of a reference term, such as "an embodiment," "some embodiments," "an example," "a specific example," or "some examples," means that a particular feature, structure, material, or characteristic described in connection with the embodiment or example is included in at least one embodiment or example of the present disclosure. In this specification, the schematic representations of the terms used above are not necessarily intended to refer to the same embodiment or example.

Furthermore, the particular feature, structure, material, or characteristic described may be combined in any suitable manner in any one or more embodiments or examples. Furthermore, embodiments of the present disclosure and features of the embodiments may be combined with each other without contradiction. The present disclosure will be described in detail below with reference to the accompanying drawings in conjunction with embodiments.

Detailed descriptions of known functions and known components may be omitted in order to keep the following description of the embodiments of the present disclosure clear and concise. When any component of an embodiment of the present disclosure appears in more than one drawing, that component is identified by a same reference numeral in each drawing. Unless otherwise indicated, in a case where specific techniques or conditions are not explicitly described in the following examples, those skilled in the art may follow those techniques or conditions commonly employed in the art or in the product specification.

As is known, an AMOLED display includes a plurality of pixels arranged in a matrix, and performs gray scale display by controlling each pixel through a pixel compensation circuit inside the pixel. In the pixel compensation circuit of the AMOLED display, a Gate Driver on Array (GOA) circuit needs to be configured to output a control signal for the pixels. The GOA circuit is generally disposed on both sides of the AMOLED display, and for the AMOLED display with a high resolution, a dual-side driving GOA needs to be designed to ensure normal display of an image. Therefore, a width of a bezel is one of parameters that are not negligible when designing a display.

However, when the AMOLED display is applied to, for example, a wearable or mobile electronic apparatus, since an area of the electronic apparatus itself is relatively small, a basic packaging area and a cathode overlapping area are reserved in the bezel, and a GOA (Gate Driver on Array) circuit of the AMOLED display occupies the bezel area of the AMOLED display, and thus the width of the bezel of the AMOLED display is relatively large, the display area is relatively small, and the display effect of the display apparatus is affected.

The present disclosure provides, inter alia, a display panel, a method of manufacturing a display panel, a display device, and a display apparatus, which substantially obviate one or more of the problems due to limitations and disadvantages of the related art. In the present disclosure, a signal bus occupying a large amount of bezel space is arranged to pass through the display area of the display panel, so that the width of the bezel of the display panel or the display device is effectively reduced, and the display effect of the display panel is not affected.

The AMOLED display has a plurality of pixels arranged in an array, and a pixel compensation circuit inside the AMOLED display is used to drive and control each pixel to display gray scale, where the pixel compensation circuit mainly includes a TFT (Thin-film transistor), a capacitor, and an OLED (Organic Light Emitting Diode). When the AMOLED display operates, the driving transistor in each pixel drives the corresponding OLED light-emitting device to emit light, so that the self-illuminance function of the AMOLED display is realized. Thin film transistors are components for switching and driving pixel points, and are commonly used by light emitting devices in pixels of an LCD display screen, an LED display screen or an OLED display screen, and a pixel circuit formed by a plurality of thin film transistors in the sub-pixel in each pixel point can control the sub-pixel in an on or off state, so that the display of images on a display screen is realized.

A common pixel compensation circuit may include a plurality of thin film transistors and a storage capacitor, and is referred to as an NT1C type pixel compensation circuit, where N is an integer greater than or equal to 2. When the pixel compensation circuit drives the sub-pixels to operate, the thin film transistor coupled with a gate of the driving transistor is in an off state (i.e., is turned off), a leakage current exists, and the leakage current affects the gate voltage of the driving transistor, so that a current in the light emitting device is unstable, and the display brightness is affected. Therefore, in the pixel compensation circuit, the thin film transistor coupled with the gate of the driving transistor is generally a double-gate thin film transistor, which can reduce the leakage current, ensure that the light emitting device can be normally driven, and ensure the display effect.

FIG. 1 is a schematic structural diagram of an example of a pixel compensation circuit according to the related art. As shown in FIG. 1, the pixel compensation circuit is of 7T1C type, and specifically, the pixel compensation circuit includes seven thin film transistors T1 to T7 and one storage capacitor C1. Since the first thin film transistor T1 is coupled to a first electrode of the fourth thin film transistor T4 and a gate of the second thin film transistor (driving transistor) T2, in order to ensure the display effect, the first thin film transistor T1 and the fourth thin film transistor T4 are double-gate thin film transistors, and the first electrode may be a source or a drain. As can be seen from FIG. 1, signals controlling the AMOLED pixel compensation circuit include a display gray-scale control signal Vdata, a negative voltage signal Vinit for reset, power supply signals ELVSS and ELVDD, and GOA signals (e.g., a gate signal, a reset signal, and an EM signal) controlling the pixel compensation circuit.

Figure 2:
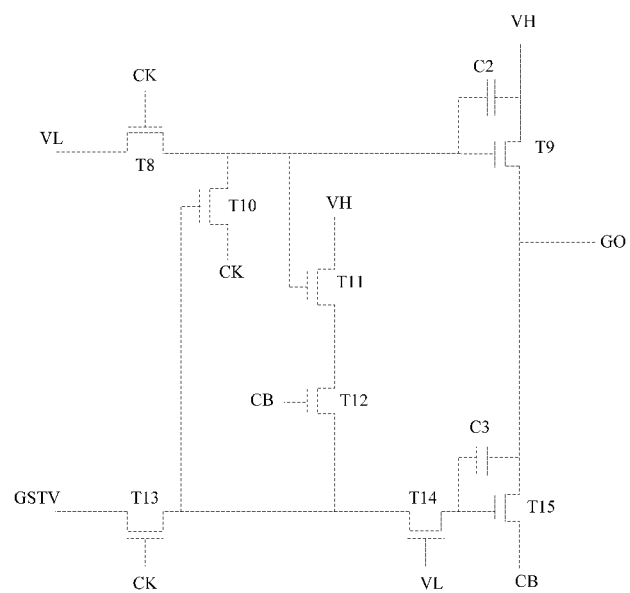
FIG. 2 is a schematic structural diagram of an example of a GOA circuit according to the related art.

FIG. 2 is a schematic structural diagram of an example of a GOA circuit according to the related art. As shown in FIG. 2, the GOA circuit is configured to provide a voltage signal for driving the pixel compensation circuit to operate normally, and specifically, the GOA circuit includes eight thin film transistors T8 to T15 and two storage capacitors C2 to C3, where the thin film transistor T14 may be omitted. As can be seen from FIG. 2, the GOA circuit includes a large number of thin film transistors, and in order to ensure the output characteristics, the thin film transistors T9 and T15 for outputting voltages each have a relatively large aspect ratio, thereby occupying a large amount of bezel space, limiting the size of the display area, and greatly affecting the product appearance.

It should be noted that, in the process of manufacturing the circuits shown in FIG. 1 and FIG. 2, an amorphous silicon layer deposited on a substrate may be formed into a polysilicon layer with a consistent silicon atom nucleation direction through an ELA (Excimer Laser Annealing) process, a first insulating layer, a first gate layer, a second insulating layer, a second gate layer, a third insulating layer, and a source-drain layer are sequentially deposited on a side of the polysilicon layer away from the substrate, and in this process, each film layer needs to be etched by a patterning process, so as to finally form a circuit, thereby implementing a function for driving a sub-pixel.

For ease of understanding and explanation, the display panel, the display device, and the electronic apparatus provided in the embodiments of the present disclosure are set forth in detail below with reference to FIGS. 3 to 5. Specifically, the display panel provided by the embodiment of the present disclosure includes a display area and a non-display area, and the display panel further includes at least one signal bus, a metal wire, and a control circuit, where the at least one signal bus is located in the display area and crosses (or passes through) the display area, the metal wire is also located in the display area and is electrically coupled to the at least one signal bus, the control circuit (such as a pixel compensation circuit, etc.) is disposed in the non-display area, and the metal wire is electrically coupled to the control circuit.

It is to be noted that, in the embodiment of the present disclosure, the signal bus may include a negative voltage signal line, an image display control signal line, a direct current signal line, and a power supply signal line. For example, in some implementations, the negative voltage signal line is a Vinit signal line, the image display control signal line is a Vdata signal line, the power supply signal line is an ELVSS/ELVDD signal line, and so on.

Figure 3:
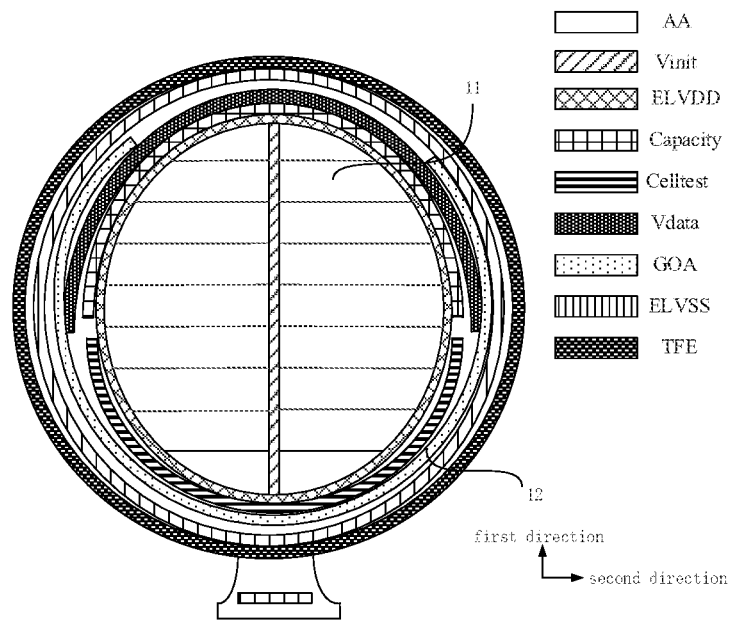
FIG. 3 is a diagram of a display device according to an embodiment of the present disclosure.

FIG. 3 is a diagram of a display device according to an embodiment of the present disclosure. Referring to FIG. 3, a case where a shape of bezel of the display device is circular, and the signal bus is the negative voltage signal line Vinit is taken as an example for illustration. After the Vinit signal bus penetrates through an AA area (Active Area, i.e., display area) of the display panel, the Vinit signal bus extends to both sides of the AA Area (e.g., in a first direction) and is electrically coupled with a metal wire, i.e., the metal wire extends from middle pixels in the AA Area to pixels at both ends in a second direction to be coupled to a control circuit of the display panel, such as a pixel compensation circuit, and the remaining types of signal buses (e.g., the image display control signal line Vdata, the power supply signal line ELVSS/ELVDD) are disposed in the non-display area at a periphery of the AA area, where Capacity represents a capacitance compensation region, and TFE represents a packaging region. It should be noted that the Vinit signal bus may passes through the display area at any position, which is not limited in the embodiment of the present disclosure. In some implementations, the Vinit signal bus passes through a center of the display area.

Since the Vinit signal bus divides the AA area into two areas, a width of the signal bus and sizes of pixels need to be adjusted accordingly in order to ensure the uniformity of the display effect of the display panel. For example, in some implementations, assuming that the size of each pixel is 30 μm*60 μm and the width of the Vinit signal bus is 30 μm, the size of each of thirty pixels at the coupling locations of the two areas needs to be adjusted to 29 μm*60 μm, i.e., the width of each pixel at the coupling locations of the two areas is reduced by 1 μm, while the size of each pixel at other locations is unchanged and still 30 μm*60 μm. It should be noted that the width of the signal bus in the embodiment of the present disclosure refers to a span of the signal bus in the second direction, that is, a width direction (e.g., the second direction) of the signal bus is perpendicular to a width direction (e.g., the first direction) of the pixels. In some implementations, the number of pixels that need to be resized and the reduction in size of each pixel may be different according to the spatial layout of the pixels and the width of the signal bus, and the embodiments of the present disclosure are not limited to the thirty pixels disclosed above and the reduction of 0.5 μm in the width of each pixel. Meanwhile, the opening position of the pixel with the adjusted size still maintains its own period, namely, the position of the pixel for emitting light is unchanged, so that the display effect of the display panel is not influenced.

Figure 4:
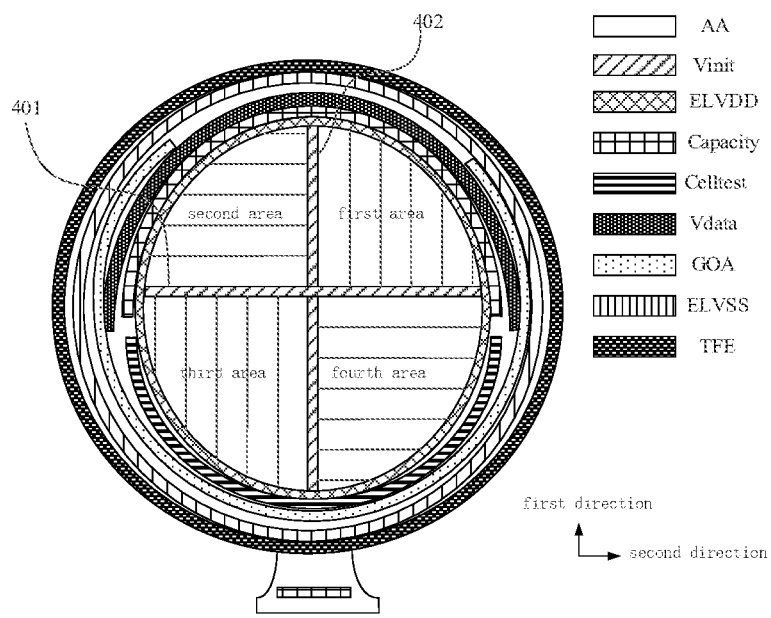
FIG. 4 is a diagram of a display device according to another embodiment of the present disclosure.

FIG. 4 is a diagram of a display device according to another embodiment of the present disclosure. Referring to FIG. 4, the shape of bezel of the display device is circular, and the signal bus is a negative voltage signal line Vinit. As shown in FIG. 4, in some implementations, the Vinit signal bus is formed as a first signal bus 401 in a second direction and a second signal bus 402 in a first direction, the first direction and the second direction are perpendicular to each other. It is to be understood that the display device has relatively many signal lines, and if more signal lines are provided in the display area so as to be coupled to, for example, the pixel compensation circuit, then the width of the bezel of the display device can be further reduced. It should be noted that the first signal bus 401 and the second signal bus 402 may pass through the display area at any locations of the display area, which is not limited in the embodiment of the present disclosure. In some implementations, the first signal bus 401 and the second signal bus 402 are perpendicular to each other and each pass through the center of the display area.

Specifically, in some implementations, the AA area is divided into four areas arranged in a counterclockwise direction by the first signal bus 401 and the second signal bus 402, as shown in FIG. 4. The metal wires in the first and third areas are electrically coupled to the first signal bus 401 and the metal wires in the second and fourth areas are electrically coupled to the second signal bus 402. A total length of all pixels coupled to the first signal bus 401 in the first direction is reduced by ½ of the width of the first signal bus 401 in the first direction, and a total length of all pixels coupled to the second signal bus 402 in the second direction is reduced by ½ of the width of the second signal bus 402 in the second direction. For example, in some implementations, assuming that the size of the pixel is 30 μm*60 μm and the width of the Vinit signal bus is 30 μm, it is necessary to reduce a length of each of thirty pixels coupled to the first signal bus 401 by 0.5 μm in the first direction, and to reduce a length of each of thirty pixels coupled to the second signal bus 402 by 0.5 μm in the second direction, and the size of each of the pixels at other locations is not changed and still is 30 μm*60 μm. In some implementations, the width of the first signal bus 401 in the first direction is the same as the width of the second signal bus 402 in the second direction, but the present disclosure is not limited thereto. In some implementations, the number of pixels that need to be resized and the reduction in size of each pixel may be different according to the spatial layout of the pixels and the width of the signal bus, and the embodiments of the present disclosure are not limited to the thirty pixels disclosed above and the reduction of 0.5 μm in the width of each pixel. In the embodiment of the present disclosure, all pixels coupled to a same metal bus are reduced by the same size, rather than that the size of the pixels coupled to the same metal at one side are reduced and the pixels at the other side are not reduced, thereby ensuring that the display effect of the resized pixels is uniform.

Figure 5:
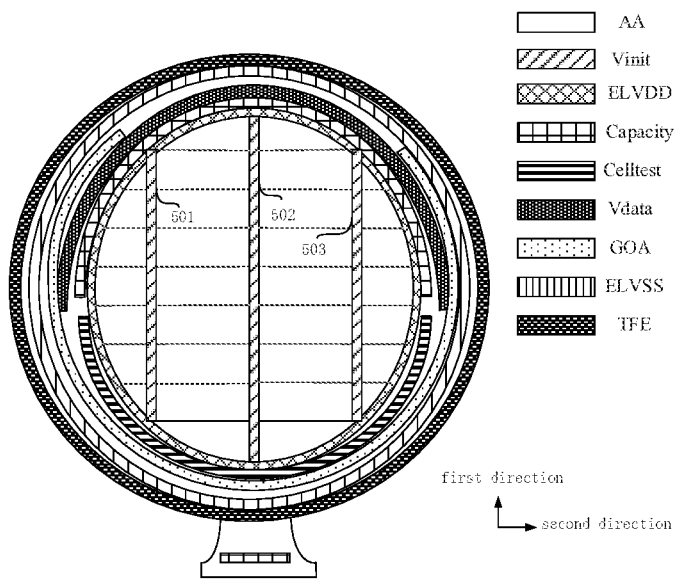
FIG. 5 is a diagram of a display device according to another embodiment of the present disclosure.

FIG. 5 is a diagram of a display device according to another embodiment of the present disclosure. Referring to FIG. 5, a case where the shape of the bezel of the display device is circular, and the signal bus is a negative voltage signal Vinit is taken as an example. As shown in FIG. 5, in some implementations, the Vinit signal bus is formed as three signal buses, e.g., a first signal bus 501, a second signal bus 502, and a third signal bus 503, that are parallel to each other in a first direction. It is to be understood that the display device has relatively many signal lines, and if more signal lines are provided in the display area so as to be coupled to, for example, the pixel compensation circuit, the width of the bezel of the display device can be further reduced. It should be noted that the three signal buses may pass through the display area at any location of the display area, which is not limited in the embodiment of the present disclosure.

Specifically, in some implementations, the AA area is divided into four areas by three signal buses. In some implementations, a total length of all pixels coupled to each of the three signal buses in the second direction is reduced by ½ of the width of the signal bus in the second direction. In some implementations, a total length of all pixels coupled to the first signal bus in the second direction is reduced by ½ of the width of the first signal bus in the second direction, a total length of all pixels coupled to the second signal bus in the second direction is reduced by ½ of the width of the second signal bus in the second direction, and a total length of all pixels coupled to the third signal bus in the second direction is reduced by ½ of the width of the third signal bus in the second direction. For example, in some implementations, assuming that the size of the pixel is 30 μm*60 μm and the width of the Vinit signal bus is 30 μm, it is necessary to reduce the width of each of thirty pixels coupled to each of the three signal buses by 0.5 μm in the second direction, and the size of each of the pixels at other locations is not changed and still is 30 μm*60 μm. In some implementations, the widths of the first signal bus 501, the second signal bus 502, and the third signal bus 503 in the second direction are the same, but the present disclosure is not limited thereto. In some implementations, the number of pixels that need to be resized and the size of each pixel need to be reduced may be different according to the spatial layout of the pixels and the width of the signal bus, and the embodiments of the present disclosure are not limited to the thirty pixels disclosed above and the reduction of 0.5 μm in width of each pixel. In the embodiment of the present disclosure, the size of each of all pixels coupled to the signal bus is reduced by the same size, instead of reducing the size of each of the pixels coupled to the signal bus at one side and not reducing the size of each of the pixels at the other side, thereby ensuring that the display effect of the resized pixels is uniform.

According to the display panel provided by the embodiment of the disclosure, the display panel includes a display area and a non-display area, where at least one signal bus is arranged in and passes through the display area and extends to two sides (for example, in a first direction) of the display area to be electrically coupled with metal wires, and the metal wires are configured for electrically coupling with a control circuit such as a pixel compensation circuit of the display panel. The signal bus occupying a large amount of space is arranged in the display area of the display panel, so that the signal bus extends towards two sides (for example, in the first direction) of the display area to be electrically coupled with the metal wires, namely, the metal wires extend from the middle pixels of the display area to the pixels at two ends in the second direction and are electrically coupled with the control circuit of the display panel, such as the pixel compensation circuit, thereby avoiding the arrangement of the signal bus in the bezel of the display device, saving the bezel space and further reducing the width of the bezel of the display device.

In another aspect, an embodiment of the present disclosure further provides a method of manufacturing the display panel described herein. In some implementations, the method includes: forming at least one signal bus in the display area, and forming a plurality of metal wires in the second direction in the display area, where an end of each metal wire is electrically coupled with the at least one signal bus; and forming a control circuit in the non-display area, where the control circuit is electrically coupled with another end of the metal wiring.

Figure 6:
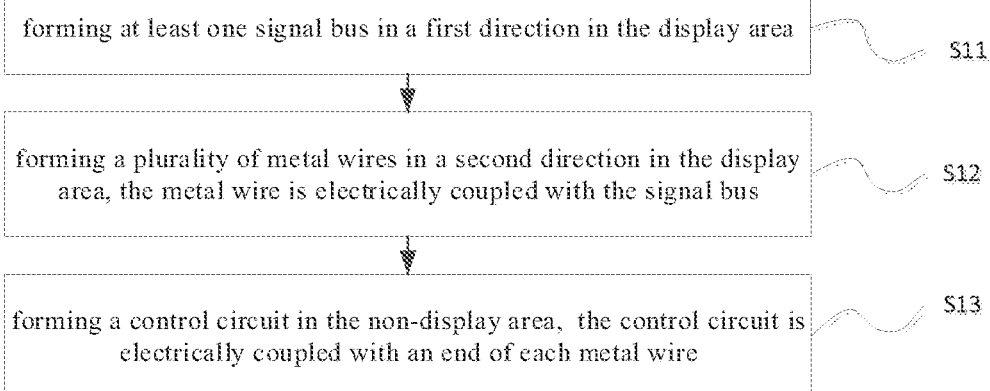
FIG. 6 is a flowchart of a method of manufacturing a display panel according to an embodiment of the present disclosure.

FIG. 6 is a flowchart of a method of manufacturing a display panel according to an embodiment of the present disclosure. In some implementations, the method includes steps S11, S12 and S13.

In step S11, forming at least one signal bus in the display area in the first direction, the at least one single bus passing through the display area. In some implementations, the signal bus is formed to pass through a center of the display area.

In some implementations, the signal bus is formed as a first signal bus in a second direction and a second signal bus in a first direction, the first direction and the second direction being perpendicular to each other.

In some implementations, the signal bus is formed as a first signal bus, a second signal bus, and a third signal bus that are parallel to each other in the first direction.

In step S12, forming a plurality of metal wires along a second direction in the display area, an end of each of the metal wires being electrically coupled to the signal bus. In some implementations, a portion of the plurality of metal wires may be electrically coupled to the first signal bus and the other portion of the plurality of metal wires may be electrically coupled to the second signal bus.

In some implementations, a portion of the plurality of metal wires may be electrically coupled with the first signal bus, another portion of the plurality of metal busses may be electrically coupled with the second signal bus, and a remaining portion of the plurality of metal busses may be electrically coupled with the third signal bus.

In step S13, forming a control circuit in the non-display area, the control circuit being electrically coupled to another end of the metal bus line. In some implementations, the control circuit may include a pixel compensation circuit.

According to the display panel formed by the method disclosed in the disclosure, the signal bus occupying a large amount of space is arranged in the display area of the display panel, so that the signal bus extends towards two sides (for example, in the first direction) of the display area, to be coupled with the metal wires, namely, the metal wires extend from the middle pixels of the display area to the pixels at two end in the second direction to be coupled to the control circuit, such as the pixel compensation circuit, of the display panel, so that the signal bus is prevented from being arranged in the bezel of the display device, the bezel space is saved, and the width of the bezel of the display device is reduced.

In another aspect, an embodiment of the present disclosure further provides a display device including the display panel described herein or manufactured according to the method described herein. In addition, for descriptions of the same contents in this embodiment and other embodiments, reference may be made to the descriptions in other embodiments, which are not repeated herein.

It should be noted that, the shape of the bezel of the display device in the embodiment of the present application may be, but is not limited to, a circle or a square. It should be understood that the shape of the bezel of the display device may also be irregular. The display device provided by the embodiment of the application may have various product styles for meeting the user's experience requirements.

According to the display device provided by the embodiment of the application, the signal bus occupying a large amount of space is arranged in the display area of the display panel, so that the signal bus extends towards two sides (in the first direction) of the display area, to be coupled with the metal wires, namely, the metal wires extend towards the pixels at two ends in the second direction from the middle pixels of the display area, so as to be coupled with the control circuit, such as the pixel compensation circuit, of the display panel, so that the signal bus is prevented from being arranged in the bezel of the display device, the bezel space is saved, and the width of the bezel of the display device is reduced.

In another aspect, an embodiment of the present disclosure further provides an electronic apparatus, which includes the display device described herein. For descriptions of the contents in the embodiment of the present disclosure the same as those in other embodiments, reference may be made to the descriptions in other embodiments, which are not repeated herein.

It should be noted that the electronic apparatus in the embodiment of the present disclosure may include, but is not limited to, mobile devices and wearable devices. For example, the mobile devices include Personal Digital Assistants (PDAs), Tablet computers (Tablet computers), wireless handheld devices, mobile phones, and the like, and the wearable devices include smart glasses, smart bracelets, smart watches, and the like.

According to the electronic apparatus provided by the embodiment of the present disclosure, the electronic apparatus is provided with the display device in which the signal bus passes through the display area of the display panel, and in the display device, the signal bus occupying a large amount of space is arranged in the display area of the display panel, so that the signal bus extends towards two sides (in the first direction) of the display area, to be coupled with the metal wires, namely, the metal wires extend towards the pixels at two ends in the second direction from the middle pixels of the display area, so as to be coupled with the control circuit, such as the pixel compensation circuit, of the display panel, so that the signal bus is prevented from being arranged in the bezel of the display device, the bezel space is saved, and the width of the bezel of the display device is reduced.

The foregoing description is only exemplary of the embodiments of the present application and is illustrative of the principles of the technology employed. It will be appreciated by those skilled in the art that the scope of the present application herein is not limited to the particular combination of features described above, but also encompasses other technical solutions in which any combination of the above features or their equivalents is incorporated without departing from the spirit of the present application. For example, the other technical solutions may be those in which the above features disclosed in the present application and (but not limited to) the technical features having similar functions are replaced with each other.

The invention claimed is:

1. A display panel, having a display area and a non-display area, and comprising:
   at least one signal bus located in and across the display area;
   a plurality of metal wires located in the display area and each having an end electrically coupled to the at least one signal bus and being electrically coupled to a pixel compensation circuit of the display panel; and
   a control circuit located in the non-display area and electrically coupled to another end of each of the metal wires, wherein
   the signal bus comprises at least one of a negative voltage signal line, a display control signal line, a direct current signal line, and a power supply signal line, and the negative voltage signal line is provided in the display area, the remaining signal lines of the signal bus are provided in the non-display area at a periphery of the display area;

the signal bus, as the negative voltage line, comprises a first signal bus in a second direction and a second signal bus in a first direction, the first direction and the second direction are perpendicular to each other, a portion of the plurality of metal wires are electrically coupled to the first signal bus, and another portion of the plurality of metal wires are electrically coupled to the second signal bus; and the display area is divided by the first signal bus and the second signal bus into a first area, a second area, a third area, and a fourth area arranged in a counterclockwise direction, metal wires in the first and third areas being electrically coupled with the first signal bus, and metal wires in the second and fourth areas being electrically coupled with the second signal bus.

2. The display panel of claim 1, wherein a total length of all pixels coupled with the first signal bus in the first direction is reduced by ½ of a width of the first signal bus in the first direction, and a total length of all pixels coupled with the second signal bus in the second direction is reduced by ½ of a width of the second signal bus in the second direction.

3. The display panel of claim 2, wherein the width of the first signal bus in the first direction is the same as the width of the second signal bus in the second direction.

4. The display panel of claim 3, wherein the first signal bus and the second signal bus each pass through a center of the display area.

5. A display device, comprising the display panel of claim 1.

6. The display device of claim 5, wherein the display device is circular or square in shape.

7. An electronic device, comprising the display device of claim 5.

8. A method of manufacturing the display panel of claim 1, comprising:

forming at least one signal bus in the display area, the signal bus crossing the display area;

forming a plurality of metal wires in the display area, wherein an end of each metal wire is electrically coupled with the at least one signal bus, and being electrically coupled to a pixel compensation circuit of the display panel; and forming a control circuit in the non-display area, wherein the control circuit is electrically coupled with another end of each metal wire.

9. The method of claim 8, wherein the first signal bus and the second signal bus are formed to pass through a center of the display area.

* * * * *